United States Patent [19]

Berbeco

[11] 4,231,901

[45] Nov. 4, 1980

[54] ELECTRICALLY CONDUCTIVE FOAM AND METHOD OF PREPARATION AND USE

[75] Inventor: George R. Berbeco, West Newton, Mass.

[73] Assignee: Charleswater Products, Inc., Needham, Mass.

[21] Appl. No.: 918,411

[22] Filed: Jun. 23, 1978

Related U.S. Application Data

[63] Continuation-in-part of Ser. No. 824,051, Aug. 12, 1977, Pat. No. 4,150,418.

[51] Int. Cl.³ .................. H01B 1/06; H01C 1/06
[52] U.S. Cl. .................. 252/511; 206/328; 206/331; 206/523; 252/500; 361/212; 428/311; 428/315; 521/55; 521/137
[58] Field of Search ............... 252/511, 500; 428/311, 428/315; 521/55, 137; 260/DIG. 15, DIG. 16; 361/212; 206/331, 328, 334, 523

[56] References Cited

U.S. PATENT DOCUMENTS 3,459,924  8/1969  McMichael ................... 252/511

FOREIGN PATENT DOCUMENTS 51-76363  7/1976  Japan ........................... 521/55

OTHER PUBLICATIONS

IBM Technical Disclosure Bulletin, vol. 17, No. 10 (Mar. 1975), "Protective Container for Integrated Circuit Modules".
Chemical Abstracts 82 (1975), 44199u, "Properties of Carbon Black Filled Polyurethanes Latex Films", Kurbznova, I. I. et al.

Primary Examiner—Benjamin R. Padgett
Assistant Examiner—J. Lloyd Barr
Attorney, Agent, or Firm—Richard P. Crowley

[57] ABSTRACT

An article of manufacture which comprises a urethane foam characterized by electrically conductive properties to prevent the accumulation of static charge on electronic components or devices which are placed on or wrapped in the foam or alternatively electronic devices in which the electronic leads, themselves, are inserted in an electrically conductive relationship into the foam. The urethane foam contains a binding agent and is impregnated generally uniformly therethrough with an electrically conductive amount of an electrically conductive particulate material.

27 Claims, No Drawings

ELECTRICALLY CONDUCTIVE FOAM AND METHOD OF PREPARATION AND USE

REFERENCE TO PRIOR APPLICATION

This application is a continuation-in-part of my copending U.S. patent application Ser. No. 824,051, filed Aug. 12, 1977, hereby incorporated by reference, now U.S. Pat. No. 4,150,418.

BACKGROUND OF THE INVENTION

Foam, having electrically conductive properties, is desirable for use in environments where electronic components or discrete devices may be subject to a static charge, either generated by people or the environment, itself, such as in shipping, transporting, or otherwise moving such electronic components from place to place, both in manufacture of electronic devices and equipment and in transporting both discrete devices and equipment. Typically, in an electronic manufacturing operation, production personnel utilize inexpensive synthetic materials for floor covering, as well as wearing apparel, such material being subject to rapid static-charge buildup and maintenance. Likewise, in shipping electronic components and devices, the shipping-room and receiving-room personnel may generate static charges in a normal course of business, which may be imparted to electronic components or devices in their handling and shipping.

It has been an accepted occurrence that some metal-oxide semiconductor (MOS) devices can be destroyed by less than 100 volts of static charge, and field-effect transitors (FET) are also damaged by static charges. Personnel handling such devices can easily hold over 10,000 volts of static charge. MOS manufacturers often utilize equipment and safeguard systems to prevent static-charge accumulation and subsequent destruction of these electronic devices. MOS devices are often packaged in conductive materials, spring clip and conductive dual in-line sticks. These forms of packaging short or shunt the devices, so that all have the same potential. Some manufacturers ship their devices with conductive leads shorted with a wire spring clip or aluminum dip stick. Such protection is also sought for MOS/FET circuits, as well as microprocessor chips and various integrated circuits.

In these environments, conductive products are utilized in order to provide a circuit to ground for any static electrical charge which has been built up or to provide a means to short all the leads on an electronic component to prevent a potential difference between such leads. Conductive bags made of polyolefin and conductive foam made of polyurethane have been used in the past in these environments to alleviate the static electrical problem. The conductive foam may be of different thicknesses and of either low or high density. The low-density foam is very soft and provides a cushion to prevent damage to devices in their transport. High-density foam provides a crisp surface into which discrete components may be inserted directly to provide a circuit to ground, as well as to short the lead to prevent a potential difference across the discrete component.

Therefore, it is desirable to provide an improved conductive foam adapted for use in such environment, and particularly to provide an improved, economical, easily manufactured conductive foam for use in the electronics-manufacturing facility, as well as in shipping electronic devices.

SUMMARY OF THE INVENTION

My invention relates to an improved foam, particularly a urethane foam, having antistatic properties and to a method of manufacturing such foam for varying degrees of stiffness or softness and to the use of such foam for particular and desirable end-use applications.

My invention is directed toward improved open-cell foams having antistatic properties to prevent the accumulation of static charge in the packaging and using of electronic components and devices. The foam comprises foam, such as a polyurethane foam, which is impregnated with a polymeric-binding agent to bind together in the foam the antistatic amount of conductive particulate material, such as carbon-black particles. In particular, my invention is directed toward the employment of easily manufactured, economical and disposable foam particularly designed for use in the electronics-manufacturing environment, wherein personnel are subject to static-charge accumulation, as well as where equipment generates static charges. The foam comprises an open-cell, impregnable polyurethane foam which is impregnated with an elastomeric-type binder containing in part a film-forming polymer, and also contains an antistatic or electrically conductive amount of finely-divided, particulate, carbon-black particles dispersed about and generally uniformly throughout the impregnated urethane foam.

The conductive material employed in my foam may vary and includes, but is not limited to, the finely-divided metal particles, such as silver, aluminum and metal salts, such as aluminum silicate; although carbon-black particles are the most preferred conductive material. The conductive particles may include very finely-divided metal particles, alumina-silicate particles, such as synthetic or molecular sieves containing water, or carbon-black particles or other carbon particles or graphite fibers, alone or in combination. The amount of particulate material should be sufficient to obtain the desired amount of antistatic or electrically conductive properties, such as less than about 30,000 ohms/square inch; for example, 10,000 ohms/square inch, of surface resistance. Typically the amount ranges from about 2% to 40% by weight of the finished foam product, such as 10% to 30%, particularly 18% to 30%. The particle size of the particles to be employed may vary, but, in the preferred embodiment, finely-divided, carbon-black particles, such as carbon black having a particle size of less than 40 millimicrons, and typically from 25 to 35 millimicrons, and a nitrogen surface area ranging from 100 to 1200 square meters per gram.

The amount of particulate material employed should be insufficient to render inflexible the foam, except as specific applications may demand. The conductive material should be adequately secured to the impregnated foam with a binding agent, such that it cannot be rubbed off on contact or during use. The conductive material, such as carbon black, may be used alone or in combination with other conductive materials and additives. The foam useful in my invention may be composed of a variety of materials, but more particularly is composed of open-cell; for example, over 90% open-cell, impregnable foam, such as polyurethane, either polyether or polyester foam. The foam may be available in low-density and high-density forms, with such foam being either pigmented or unpigmented and varying in density from 0.5 lbs. per cubic foot to 10 lbs. per cubic foot; for example, 2.5 lbs. to 6 lbs. per cubic foot.

Other foams would include open-cell, vinyl-chloride foams; polyolefin foams, such as polyethylene and polypropylene; polystyrene foams; silicone foams; phenolic foams; epoxy foams; polycarbonate foams and other foam materials. The foam should be open-cell in nature, so that the foam may be impregnated adequately, rapidly and uniformly with the particulate conductive material after or during the foam formation into the particular form, density and shape of use. The foam may vary in hardness from soft to rigid.

In one embodiment, the binding agent comprises an elastomeric/polymeric material, such as butadiene-styrene resin, or similar film-forming elastomeric materials, such that the carbon-black or other particles, which impart the conductive properties, may be bound to the impregnated foam material. Typical polymeric binders to be employed are those binders which are now employed in the manufacture of saturated paper sheets, and which include, but are not limited to: polymeric binders, particularly an emulsion form, of diene-styrene elastomers, such as butadiene-styrene; acrylonitrile-styrene; copolymers and copolymers with acrylics; acrylic resins; vinyl polymers, such as vinyl halides like homopolymers or polyvinyl chloride or copolymers of the vinyl chloride with vinyl acetate and other vinyl esters and ethers; urethane emulsions and the like, wherein a part of the binding system comprises a film-forming polymer. Where a semirigid or rigid foam is employed in packaging, wherein leads of an electronic circuit, chip or component are inserted in the foam, the foam should have sufficient rigidity to retain the leads in place. Where the polymeric binder is a styrene-butadiene elastomer, I have found that the styrene content of the impregnated foam must be 25% by total weight or more; for example, 25% to 40%, or preferably over 60% to provide suitable lead retention.

The polymer-binding agent often ranges from about 1% to 60% by weight of the finished foam material; for example, 25% to 60%. The polymer, with latex employed as the binding agent, may include other ingredients and additives as desired, such as pigments, dyes, antioxidants, stabilizers, fillers, catalysts, anti-static agents, flame retardants, plasticizers, surfactants, release agents and other additives.

Thus, my foam, in its preferred embodiment, comprises an elastomeric/polymeric-binding material, which includes a film-foaming polymer, in a porous, urethane foam material which is impregnated with particulate conductive particles, such as carbon black. The foam is used to encompass or otherwise package electronic components and devices.

The conductive particles may be incorporated or impregnated into the foam material. For example, one way is by dispersing the conductive particles in solution or emulsion of the polymer-binding agent and then saturating the foam with the solution and, thereafter, drying the foam. Also the conductive particles may be added or dispersed in the urethane prior to foam formation or after and prior to adding the polymer-binding agent to the foam.

In another method, the conductive particles may be dispersed, such as by use of surfactants, particularly anionic dispersing agents, rosin acid or fatty acids with a pH of 8.5 to 11.5, in an aqueous composition and applied onto the ready-formed foam, so as to penetrate the foam material, either from one or both sides, directly at the formation of the foam, followed by impregnating the foam with a polymer-binding agent. Various other techniques, such as dusting of the conductive particles onto the surface of the foam and subsequently calendering of the foam to impregnate the particles therein, may be employed to impregnate the particles generally uniformly throughout the foam. The conductive particles also may be dispersed separately and then added to the polymeric binder; for example, carbon black may be dispersed in water with a dispersing agent, such as surfactants, and then the dispersant may be mixed with a polymeric emulsion. The foam material is then impregnated with this mixture.

For the purpose of illustration, my invention will be described in its preferred embodiment in connection with the preparation of electrically conductive foam for use in packaging and transporting. It is recognized that my foam may have other uses and advantages, and, as will be recognized by persons skilled in the art, various changes and modifications may be made in my invention, all within the spirit and scope of my invention and without departing therefrom.

DESCRIPTION OF THE EMBODIMENTS

EXAMPLE 1

A dispersion of carbon black was prepared by adding the following to a Waring Blender:

16.2 grams Vulcan XC72—an extra-conductive, oil-furnace carbon black (a trademark of Cabot Corporation)

1.9 grams Tamol SN—an anionic polymer-type dispersing agent (a trademark of Rohm and Haas Company)

0.1 grams NAOH 81.8 grams $H_2O$

The solution was dispersed at high speed for about 10 minutes. 44 grams of the above dispersion were added to 100 grams of GRS (styrene-butadiene latex, 17.6% solids, 35% styrene and 55% butadiene at pH=10.0). A ½-inch-thick piece of ether urethane foam (open-cell) was saturated with the solution and was run through a laboratory textile paddle (wringer). The resulting foam was air-dried, and a second piece was dried in an oven at 80° C. Both foam pieces had a resulting resistance of less than 5000 ohm/inch$^2$ when measured with a 500,000-volt Volt Ohm Meter.

EXAMPLE 2

The viscosity of the solution from Example 1 was increased by addition of 10 grams of Cab-O-Sil (an anhydrous and particulate colloidal silica, a trademark of Cabot Corporation) to form a solution of muddy consistency, and then the foam was padded as in Example 1. The resulting foam had a resistance less than 5000 ohm/inch$^2$.

EXAMPLE 3

A dispersion of carbon black in water, suitable for use in my invention, was prepared as follows:

20 grams Vulcan XC72

2 grams Microsperse —a nonionic dispersing agent (a trademark of ICI Americas, Inc.)

0.1 grams NAOH 77.9 grams $H_2O$

The products were combined in a high-shear mixer and were dispersed at high speed for 10 minutes. The resultant mixture was a stable dispersion with pH=11.0.

The solution may be used to impregnate a foam or to be added to a foamable composition and secured with a film-forming polymer.

EXAMPLE 4

A solution for impregnating a ¼-inch-thickness, low-density, porous, white ether foam (urethane) was prepared by combining 3½ gallons of 55/35 styrene-butadiene copolymer with 55% solids, 1 gallon of a 50% solids polystyrene-polymer latex, and 4½ gallons of a dispersion (20% by weight) of Cabot XC72 carbon black and water. The solution was agitated in a wringer washer, foam was immersed in the solution and run through the wringer. The foam was subsequently slightly stretched between two horizontal steel angles to permit drying without wrinkling. The resulting foam had an electrical surface resistance of 10,000 ohms/inch². Also the resulting foam was sufficiently rigid to insert a microprocessor discrete component into the foam.

EXAMPLE 5

The solution in EXample 4 was revised to 2.47 gallons of 55/35 styrene-butadiene copolymer latex, 1 gallon of a 50% solids polystyrene latex and 2 gallons of the carbon-black dispersion of Example 2. The resulting foam, after immersion, wringing and drying in a stretched position, was stiffer than the product resulting from Example 4, and yet had an equivalent electrical-surface resistance. The urethane foam may be air-dried, but preferably is dried in an oven at 100° F. to 300° F.

EXAMPLE 6

The preparation of relatively stiff, conductive, urethane foam, for the purpose of inserting directly the leads of discrete components, is accomplished as follows: The open-cell foam was saturated, after preparation of the solution, with the appropriate solution as in Examples 4 and 5. The foam was stretched (slightly) between two steel angles, with the foam being held in a vertical position. This drying arrangement permits drying of the foam without wrinkling or other changes in the surface appearance of the impregnated foam.

EXAMPLE 7

An impregnating solution was prepared by the addition of 4 gallons of a film-forming styrene-butadiene latex comprising approximately 47% styrene and 53% butadiene copolymer with a rosin-acid emulsifier system, at 42% total solids and a pH of 11. This latex was added to 2 gallons of a 20% by weight carbon-black dispersion and was agitated in a wringer washing machine. About ½ inch-thickness, porous, urethane foam was immersed in the solution and was wrung through the wringer. The resulting foam, upon drying, was very soft and flexible and exhibited no loss of carbon black when rubbed manually. The electrical-surface resistance was approximately 20,000 ohms/inch².

EXAMPLE 8

A solution was prepared as in Example 7, utilizing a styrene-butadiene latex with a ratio of 67% styrene and 33% butadiene, an anionic emulsifier system, 55% solids and a pH of 8.5. The resulting foam from this impregnation was stiffer than in the previous example and was not as flexible.

EXAMPLE 9

The latex solution, as prepared in Example 6, was left standing at room temperature for 3 hours. This solution gelled and was no longer usable. The same solution was prepared as in Example 6, except for the addition of 6 parts by weight of emulsifier K (W. & R. Grace Co.) and 14 parts emulsifier W (W. & R. Grace Co.) per 100 parts of styrene-butadiene latex of Example 4, the emulsifiers being added to the latex prior to mixing with the carbon-black dispersion. This solution, upon treatment of urethane foam, resulted in a stiff foam, with a surface-electrical resistance of less than 30,000 ohm/inch², and was rigid enough for insertion of the leads of a microprocessor. Also the resulting solution was stable for a period of 12 hours, but gelation occurred after 24 hours. Both emulsifiers K and W are anionic dispersing agents and permit absorption onto the high surface area of the conductive carbon black, without resulting in removal of sufficient emulsifier from the latex to bring about precipitation within a short period of time.

EXAMPLE 10

A nonfilm-forming latex of 65% styrene/35% butadiene copolymer of 50% solids was mixed in a 2:1 ratio with a 20% conductive carbon-black dispersion. Urethane foam was saturated by dipping in the solution and the excess solution was removed. The resulting foam had a surface resistance of about 30,000 ohms/inch². However, the foam, on finger contact and abrasion, released carbon black when rubbed.

EXAMPLE 11

An impregnating solution was prepared by the addition of four gallons of a styrene-butadiene film-forming copolymer latex comprising approximately 47% styrene and 53% butadiene copolymer with a rosin-acid emulsifier system, 42% total solids and a pH of 11. This latex was added to eight gallons of 50% solids polystyrene latex, and 3.5 gallons of a 20% by weight carbon-black dispersion and was agitated in a wringer washing machine. About ½ inch-thickness, porous, urethane foam with a density of approximately 1.5 pounds per cubic foot was immersed in the solution and was wrung through the wringers. The resulting foam, upon drying, had an electrical surface resistance of 10,000 ohms/inch². Also the resulting foam was sufficiently rigid to insert a microprocessor discrete component into the foam. The mixed solution did not change viscosity and was reusable after a sixty-day (60) period.

What I claim is:

1. An electrically conductive foam adapted for use with electronic components sensitive to static charges, which foam consists essentially of:

an open-cell polymeric foam uniformly impregnated with electrically conductive particulate material in an amount of from about 2% to 40% by weight of the impregnated foam and sufficient to provide for a surface resistance of the foam of less than about 30,000 ohms per square inch, the particulate material having a particle size of less than 40 millimicrons, and from about 1% to 60% by weight of the impregnated foam of a film-forming polymeric-binding material securing the conductive particulate material to the foam.

2. The foam of claim 1 wherein the foam density ranges from about 0.5 to 10 pounds per cubic foot.

3. The foam of claim 1, which foam is an open-cell urethane foam.

4. The foam of claim 1 wherein the conductive particulate material comprises from about 10% to 30% by weight of the foam.

5. The foam of claim 1 wherein the electrically conductive particulate material is carbon black.

6. The foam of claim 5 wherein the carbon black has a nitrogen surface area ranging from about 100 to 1200 $m^2$/gram.

7. The foam of claim 1 wherein the film-forming polymeric binder comprises a styrene-butadiene polymer or a combination of a styrene-butadiene copolymer with a polystyrene polymer.

8. The foam of claim 7 wherein the particulate material is carbon black and the polymeric-binding material has over about 60% by weight of styrene.

9. The foam of claim 1 wherein the particulate material is carbon black, and which foam has a surface resistance of less than about 5000 ohms per square inch.

10. An electrically conductive foam adapted for use with electronic components sensitive to static charges, which foam consists essentially of:
an open-cell, polymeric, urethane foam having a foam density ranging from about 0.5 to 10 pounds per cubic foot and uniformly impregnated with electrically conductive, carbon-black particulate material having a particle size of less than about 40 millimicrons and a nitrogen surface area ranging from about 100 to 1200 $m^2$/gram, the carbon-black particulate material comprising from about 10% to 30% by weight of the foam and in an amount sufficient to provide for a surface resistance of the foam of less than about 10,000 ohms per square inch, and a film-forming polymeric-binding material comprising a styrene-containing polymer and a polystyrene polymer, present in an amount of from 25% to 60% by weight of the impregnated foam, securing the conductive particulate material to the foam.

11. The process of claim 1 wherein the foam density ranges from about 0.5 to 10 pounds per cubic foot.

12. The process of claim 1 wherein the foam is an open-cell urethane foam.

13. The process of claim 1 wherein the conductive particulate material comprises from about 10% to 30% by weight of the foam.

14. The process of claim 1 wherein the electrically conductive particles are carbon black.

15. The process of claim 14 wherein the carbon black has a particle size of about 25 to 35 millimicrons and a nitrogen surface area ranging from about 100 to 1200 $m^2$/gram.

16. The process of claim 1 wherein the film-forming polymeric binder comprises a styrene-butadiene polymer.

17. The process of claim 1 which includes drying the impregnated foam by drying the foam while the foam is secured to prevent shrinkage of the impregnated foam.

18. A process for preparing an electrically conductive foam adapted for use with electronic components sensitive to static charges, which process consists essentially of:
(a) providing an aqueous dispersion which comprises
  (i) electrically conductive carbon black having a particle size of less than 40 millimicrons,
  (ii) a dispersing agent for the carbon black, and
  (iii) a styrene-butadiene copolymer and a polystyrene-polymer latex having over about 60% of styrene
(b) immersing an open-cell, porous urethane foam into the aqueous dispersion to impregnate uniformly the foam with the carbon-black particles; and
(c) drying the impregnated foam to remove water and to bind the carbon-black particles to the foam with the copolymer, to provide an impregnated foam having from about 25% to 60% by weight of the styrene-butadiene copolymer and about 10% to 30% by weight of carbon-black particles, the foam having a surface resistance of less than about 10,000 ohms per square inch.

19. The process of claim 18 which includes drying the impregnated foam in a stretched condition between fixtures at an oven temperature of 100° F. to 300° F.

20. An article which comprises in combination:
(a) the foam of claim 1 wherein the foam is a rigid foam; and
(b) an electronic device subject to damage by static charges and having one or more electrical leads, the leads inserted and retained in the rigid foam and in an electrically conductive relationship therewith, to prevent the accumulation of damaging static charge on the electronic device.

21. An article which comprises in combination:
(a) the foam of claim 1; and
(b) an electronic device subject to damage by static charge, the device being in electrical contact with the foam of claim 1.

22. The article of claim 21 wherein the electrical device comprises a metal-oxide semiconductor device, a microprocessor chip or an integrated circuit.

23. The article of claim 21 wherein the foam is a flexible foam and wherein the electronic device is packaged in and is surrounded by the foam, to provide for a cushioning of the electronic device, as well as preventing the accumulation of static charge therein.

24. A process for preparing electrically conductive foam adapted for use with electronic components sensitive to static charges, which process consists essentially of:
(a) impregnating a substantially open-cell, porous foam with an aqueous dispersion consisting essentially of from about 2% to 40% by weight of electrically conductive particulate material in an amount sufficient to provide for the surface resistance of the dried foam of less than about 30,000 ohms per square inch, the particulate material having a particle size of less than 40 millimicrons, the dispersion containing from about 1% to 60% by weight of the impregnated foam of a film-forming polymeric-binding material to secure the conductive particulate material to the foam, and a dispersant agent for the dispersion of said particulate material in the aqueous dispersion;
(b) removing excess water from the foam; and, thereafter,
(c) heating the uniformly impregnated foam at a temperature sufficient to dry the foam and to bind the particulate material in the foam by the film-forming polymer, and to provide a surface resistance of the impregnated, bound, dried foam of less than about 30,000 ohms per square inch.

25. The process of claim 24 wherein the dispersing agent comprises an anionic surfactant.

26. The process of claim 25 wherein the surfactant has a pH in an aqueous composition of from 8.5 to 11.5.

27. The process of claim 24 which includes, firstly applying an aqueous dispersion of the carbon-black particles with an anionic-surfactant dispersing agent in an aqueous composition to the foam to penetrate the foam and, thereafter, impregnating the foam with an aqueous composition of a film-forming polymer-binding material.

* * * * *